(12) United States Patent
Chidambarrao et al.

(10) Patent No.: US 6,979,851 B2
(45) Date of Patent: Dec. 27, 2005

(54) STRUCTURE AND METHOD OF VERTICAL TRANSISTOR DRAM CELL HAVING A LOW LEAKAGE BURIED STRAP

(75) Inventors: Dureseti Chidambarrao, Weston, CT (US); Jack Allan Mandelman, Flat Rock, NC (US); Carl John Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 302 days.

(21) Appl. No.: 10/265,558

(22) Filed: Oct. 4, 2002

(65) Prior Publication Data
US 2004/0066666 A1 Apr. 8, 2004

(51) Int. Cl.⁷ ............................................. H01L 29/76
(52) U.S. Cl. ............... 257/301; 257/296; 257/297; 257/298; 257/300; 257/302; 257/304
(58) Field of Search ................. 257/301, 300, 257/296, 297, 298, 302, 304

(56) References Cited

U.S. PATENT DOCUMENTS

| | | |
|---|---|---|
| 6,180,975 B1 | 1/1993 | Radens et al. |
| 5,784,311 A | 7/1998 | Assaderaghi et al. |
| 5,827,765 A | 10/1998 | Stengl et al. |
| 5,831,301 A | 11/1998 | Horak et al. |
| 5,923,971 A | 7/1999 | Ho et al. |
| 5,945,707 A | 8/1999 | Bronner et al. |
| 5,949,700 A | 9/1999 | Furukawa et al. |
| 5,953,607 A | 9/1999 | Hakey et al. |
| 5,998,253 A * | 12/1999 | Loh et al. ................... 438/243 |
| 6,110,792 A | 8/2000 | Bronner et al. |
| 6,121,651 A | 9/2000 | Furukawa et al. |
| 6,144,054 A | 11/2000 | Agahi et al. |
| 6,153,902 A | 11/2000 | Furukawa et al. |
| 6,163,045 A * | 12/2000 | Mandelman et al. ....... 257/301 |
| 6,177,696 B1 | 1/2001 | Bronner et al. |
| 6,184,549 B1 | 2/2001 | Furukawa et al. |
| 6,190,971 B1 | 2/2001 | Gruening et al. |
| 6,201,272 B1 | 3/2001 | Kotecki et al. |

(Continued)

Primary Examiner—Paul E. Brock, II
Assistant Examiner—Doug Menz

(57) ABSTRACT

A structure and method is disclosed herein for a vertical transistor DRAM cell having a low leakage buried strap outdiffusion conductively connecting a storage capacitor in a lower portion of a trench to a vertical transistor thereabove. In the disclosed structure and method, the buried strap outdiffusion (BSOD) extends along a portion of the isolation collar having reduced thickness, the reduced thickness being substantially less than the thickness of the isolation collar otherwise. In a particular embodiment, a self-aligned lightly doped drain (LDD) extension is formed, extending between the BSOD and the vertical transistor above the LDD.

12 Claims, 12 Drawing Sheets

U.S. PATENT DOCUMENTS

| | | |
|---|---|---|
| 6,204,140 B1 | 3/2001 | Gruening et al. |
| 6,225,158 B1 | 5/2001 | Furukawa et al. |
| 6,229,173 B1 | 5/2001 | Gruening et al. |
| 6,236,077 B1 * | 5/2001 | Gambino et al. ............ 257/301 |
| 6,242,310 B1 | 6/2001 | Divakaruni et al. |
| 6,259,129 B1 | 7/2001 | Gambino et al. |
| 6,281,539 B1 | 8/2001 | Mandelman et al. |
| 6,284,593 B1 | 9/2001 | Mandelman et al. |
| 6,288,422 B1 | 9/2001 | Mandelman et al. |
| 6,310,375 B1 * | 10/2001 | Schrems ..................... 257/301 |
| 6,339,241 B1 | 1/2002 | Mandelman et al. |
| 6,369,419 B1 | 4/2002 | Divakaruni et al. |
| 6,373,086 B1 | 4/2002 | Mandelman et al. |
| 6,376,324 B1 | 4/2002 | Mandelman et al. |
| 6,399,978 B2 | 6/2002 | Gruening et al. |
| 6,406,970 B1 * | 6/2002 | Kudelka et al. ............ 438/386 |
| 6,420,750 B1 | 7/2002 | Divakaruni et al. |
| 6,426,252 B1 | 7/2002 | Radens et al. |
| 6,426,526 B1 | 7/2002 | Divakaruni et al. |
| 6,437,381 B1 * | 8/2002 | Gruening et al. ........... 257/296 |
| 6,437,401 B1 * | 8/2002 | Mandelman et al. ....... 257/330 |
| 6,440,872 B1 | 8/2002 | Mandelman et al. |
| 6,451,648 B1 | 9/2002 | Gruening et al. |
| 6,452,224 B1 * | 9/2002 | Mandelman et al. ....... 257/296 |
| 6,518,119 B2 | 2/2003 | Gambino et al. |
| 6,555,862 B1 | 4/2003 | Mandelman et al. |
| 6,563,160 B2 | 5/2003 | Clevenger et al. |
| 6,566,191 B2 | 5/2003 | Hsu et al. |
| 6,570,207 B2 | 5/2003 | Hsu et al. |
| 6,570,208 B2 | 5/2003 | Mandelman et al. |
| 6,573,137 B1 | 6/2003 | Divakaruni et al. |
| 6,576,945 B2 | 6/2003 | Mandelman et al. |
| 6,599,798 B2 * | 7/2003 | Tews et al. .................. 438/249 |
| 6,605,838 B1 * | 8/2003 | Mandelman et al. ....... 257/305 |
| 6,630,379 B2 | 10/2003 | Mandelman et al. |
| 6,642,566 B1 | 11/2003 | Mandelman et al. |
| 6,653,678 B2 * | 11/2003 | Chidambarrao et al. .... 257/301 |
| 6,670,235 B1 * | 12/2003 | Tews et al. .................. 438/246 |
| 6,703,274 B1 | 3/2004 | Chidambarrao et al. |
| 6,707,095 B1 | 3/2004 | Chidambarrao et al. |
| 6,724,031 B1 | 4/2004 | Akatsu et al. |
| 6,727,141 B1 | 4/2004 | Bronner et al. |
| 6,727,539 B2 | 4/2004 | Divakaruni et al. |
| 6,759,291 B2 | 7/2004 | Divakaruni et al. |
| 6,759,702 B2 | 7/2004 | Radens et al. |
| 6,767,789 B1 | 7/2004 | Bronner et al. |
| 6,808,981 B2 | 10/2004 | Mandelman et al. |
| 6,815,749 B1 | 11/2004 | Mandelman et al. |
| 6,833,305 B2 | 12/2004 | Mandelman et al. |
| 2001/0038112 A1 | 11/2001 | Gambino et al. |
| 2002/0079528 A1 | 6/2002 | Divakaruni et al. |
| 2002/0085434 A1 | 7/2002 | Mandelman et al. |
| 2002/0094619 A1 | 7/2002 | Mandelman et al. |
| 2002/0102778 A1 | 8/2002 | Clevenger et al. |
| 2002/0149047 A1 | 10/2002 | Divakaruni et al. |
| 2003/0116784 A1 | 6/2003 | Divakeruni et al. |
| 2004/0061161 A1 | 4/2004 | Radens et al. |
| 2004/0063277 A1 | 4/2004 | Chudzik et al. |
| 2004/0135188 A1 | 7/2004 | Rosa et al. |
| 2004/0203208 A1 | 10/2004 | Mandelman et al. |

\* cited by examiner

STRUCTURE AND METHOD OF VERTICAL TRANSISTOR DRAM CELL HAVING A LOW LEAKAGE BURIED STRAP

FIELD OF THE INVENTION

The present invention relates to semiconductor structures and processing, and more particularly to a method of fabricating a vertical transistor cell of a dynamic random access memory (DRAM), wherein an isolation collar thereof has a reduced thickness where contacted by a buried strap outdiffusion.

BACKGROUND OF THE INVENTION

Integrated circuits, and particularly memories utilize capacitors in a variety of ways. DRAMs, in particular, employ capacitors to store charge representing a data bit. As the minimum feature size and cell architecture are scaled down, robust design points for DRAM cells utilizing planar metal oxide semiconductor field effect transistors (MOSFETs) and DT capacitors are increasingly difficult to achieve. The vertical MOSFET provides a means for better scaling. However, the back-to-back vertical MOSFET devices in the cell makes it challenging since the p-well doping required to avoid interaction between the back-to-back cells must be increased. In some instances, such increased doping results in a high electric field at the p-n junction between the buried strap outdiffusion and the p-well. This, in turn, can lead to increased junction leakage from the storage node and a degradation in the tail of the distribution of the retention time for cells in the DRAM array. An improved method and structure is needed to permit the vertical transistor DRAM cell to be further scaled while holding junction leakage to within a tolerable limit.

SUMMARY OF THE INVENTION

Accordingly, a structure and method are provided for a vertical transistor DRAM cell having a low leakage buried strap outdiffusion conductively connecting a storage capacitor in a lower portion of a trench to a vertical transistor thereabove. In such structure and method, the buried strap outdiffusion (BSOD) extends along a portion of an isolation collar having reduced thickness, the reduced thickness being substantially less than the thickness of the isolation collar otherwise. In a preferred embodiment, a self-aligned lightly doped drain (LDD) extension is formed, extending between the BSOD and the vertical transistor above the LDD.

DETAILED DESCRIPTION OF THE PREFERRED EMBODIMENTS

Figure 1:
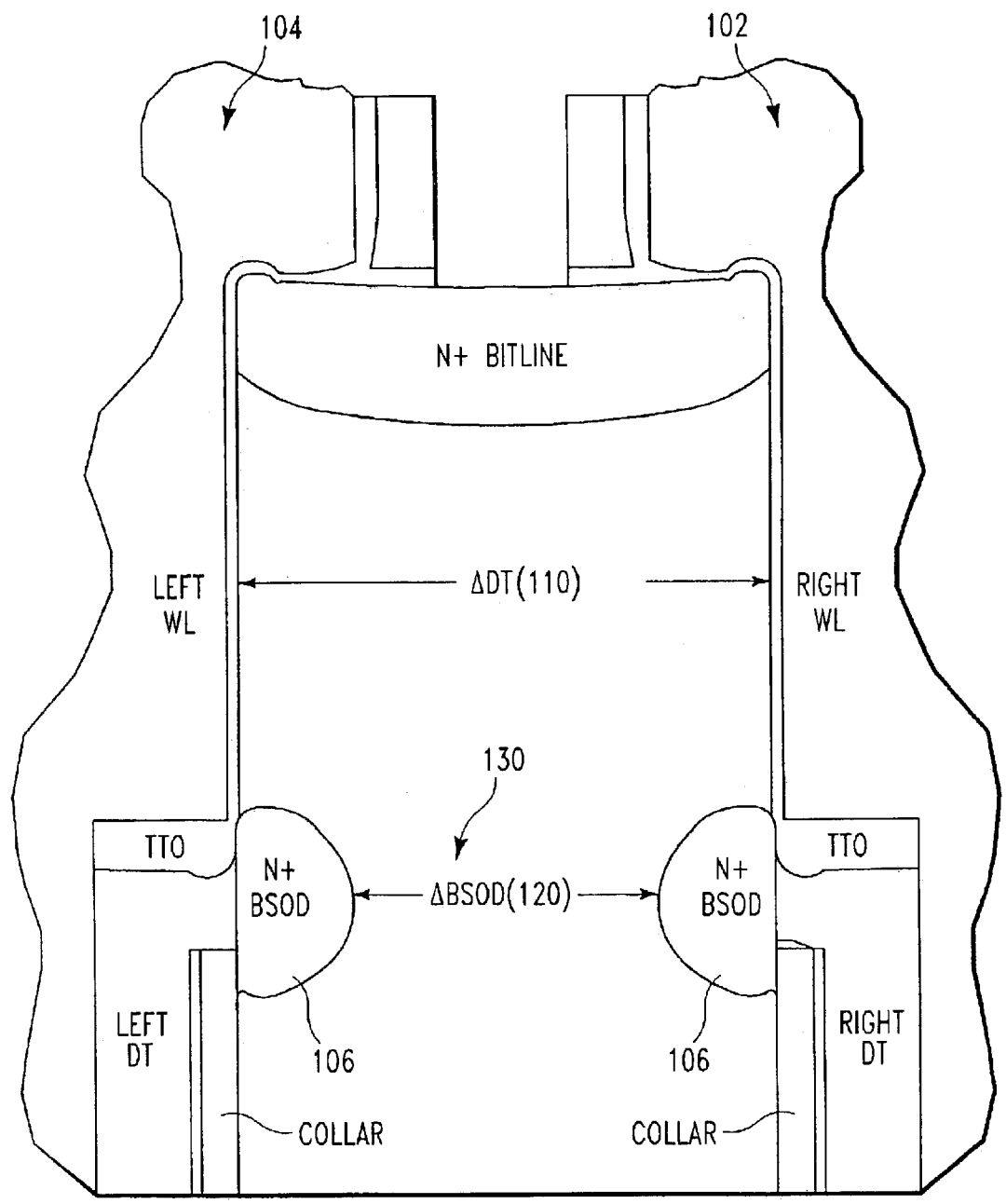
FIG. 1 is an illustration of a typical back-to-back vertical MOSFET DRAM cell.

The description herein would not be complete without describing some of the effects of electric fields associated with diffusion regions formed in a semiconductor substrate. FIG. 1 is an illustration of back-to-back vertical MOSFET cells within a DRAM array. The pair of cells are shown as (102) and (104) respectively in FIG. 1. The present scaling concerns of integrated circuits requires a reduction in the minimum lithographic feature size and in the distance between adjacent storage capacitor trenches. Such distance is shown as delta DT (110) in FIG. 1. The distance between p-n junctions 106 of the buried strap outdiffusions of the back-to-back storage capacitor trenches is shown as delta BSOD (120). As these sizes are reduced, the p-well doping (present in area 130) required to avoid interaction between the cells must be increased. However, increased P-well concentration adjoining the buried strap outdiffusion results in an undesirable increase in the electric field as well as causes storage node junction leakage and degradation of the retention time tail.

Figure 2:
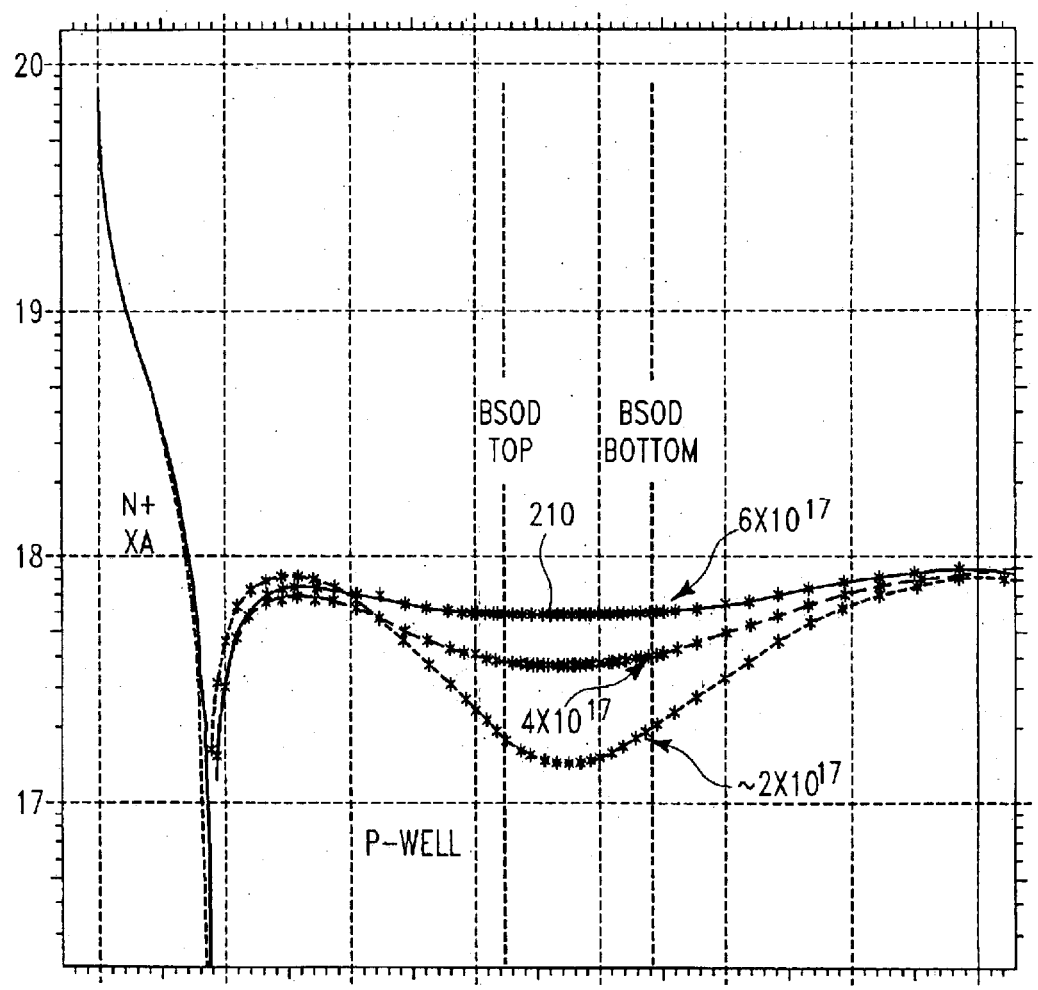
FIG. 2 is an illustration of the increased P-well concentration in the vicinity of strap diffusion.

FIG. 2 is an illustration of the increased p-well concentration in the vicinity of buried strap outdiffusion. FIG. 2 shows how model vertical doping profiles are distributed midway between back-to-back storage capacitor trenches. More particularly, as by the curve shown at (210), to avoid effects of high electric field at the junction, excessive junction leakage and degradation of the retention time tail, the P-well doping in the vicinity of the strap should not exceed $6 \times 10^{17}$ #cm$^{-3}$. However, higher P-well concentrations are desired to enable scaling to the 90 nm generation and beyond.

The competing requirements between higher P-well doping to enable scaling of the ground rule, and the requirements of maintaining the P-well doping sufficiently low (i.e. less than about $6 \times 10^{17}$#cm$^{-3}$) to avoid increased junction leakage, makes achieving scalability of this cell to the 90 nm node and beyond difficult. Therefore, alternate solutions (other than P-well doping reduction) are needed to decrease the strength of the electric field in the vicinity of the strap diffusion.

Figure 3:
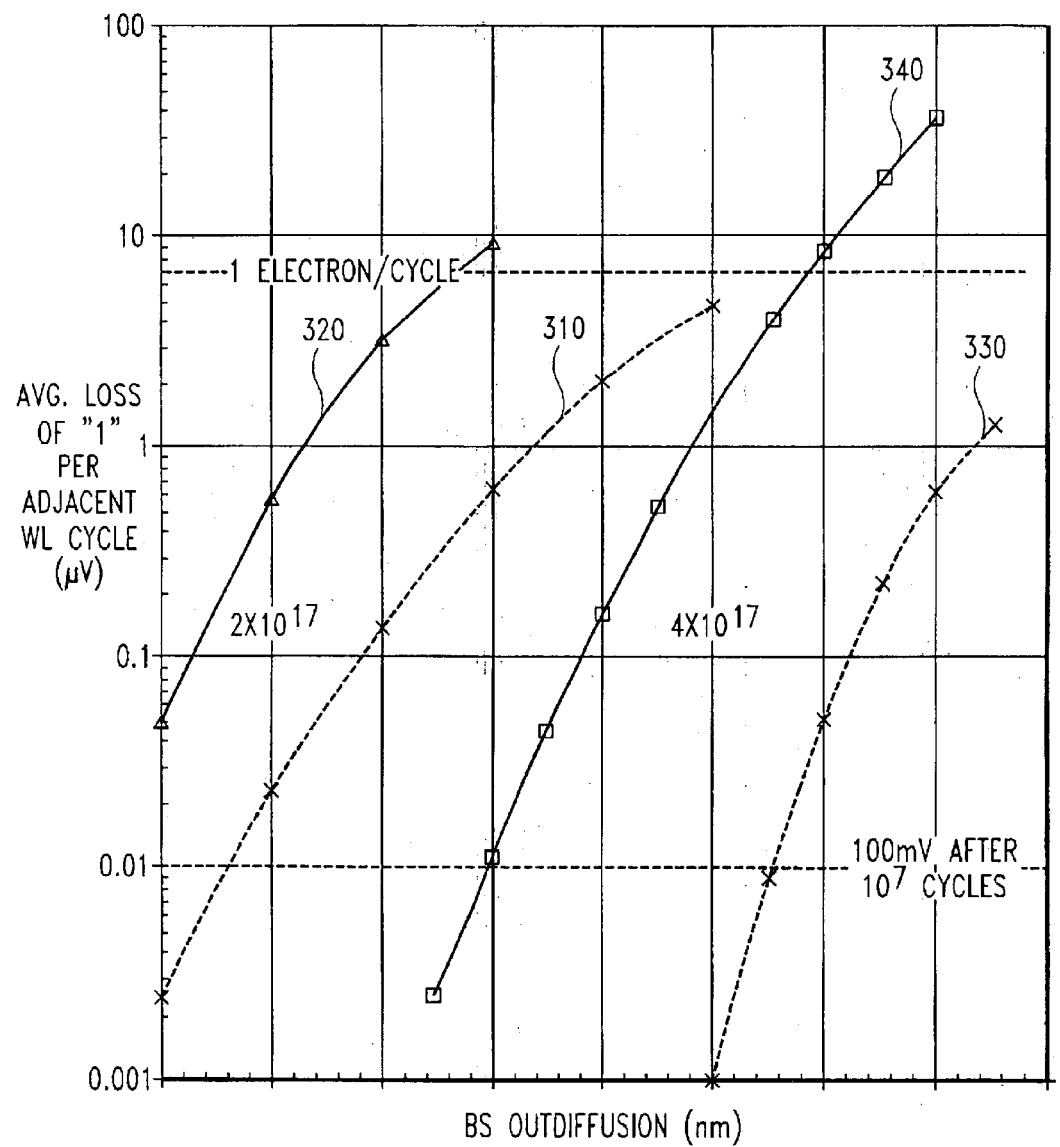
FIG. 3 is an illustration of average loss of a stored "1" a left DT per WL cycle of a right DT (as shown in FIG. 1), plotted against a change in the BS outdiffusion in nm units.

This is best understood by looking at FIG. 3 in more detail. FIG. 3 graphs modeled results for the average number of times a stored "1" is lost, when cycling back-to-back memory cells between opposite "0" and "1" states, relative to the distance, in nanometers, the buried strap outdiffusion extends into the single crystal substrate. The modeled results demonstrate the need for sufficient P-well doping concentration to avoid loss of a stored "1", due to the transient effects of cell to cell interaction. In FIG. 3, curves 310 and 320 represent the respective results for memory cells at a first groundrule (310), and at a second groundrule (320) which is smaller than the first groundrule, when the nominal p-well concentration is $2 \times 10^{17}$ #cm$^{-3}$. Curves 330 and 340 represent the respective results for the same memory cells at the first groundrule (330), and at the second groundrule (340), when the nominal p-well concentration is $4 \times 10^{17}$ #cm$^{-3}$. As the minimum feature size is reduced from the first groundrule (curves 310 and 330) to the second ground rule (curves 320 and 340), the loss of a stored "1" per cycle per adjacent wordline increases by 2 to 3 orders of magnitude, assuming no change in the extent of the buried strap outdiffusion and the p-well doping concentration. For p-well concentrations at the strap outdiffusion of less than about $4 \times 10^{17}$ #cm$^{-3}$, excessive loss of a stored "1" due to the effects of transient effects of cell to cell interaction occur. On the other hand, increasing the P-well concentration by itself at the buried strap outdiffusion is not a viable solution either, due to increased storage node junction leakage, itself which may cause loss of a stored "1" due to its adverse effect on the tail of the retention time distribution.

Figure 4:
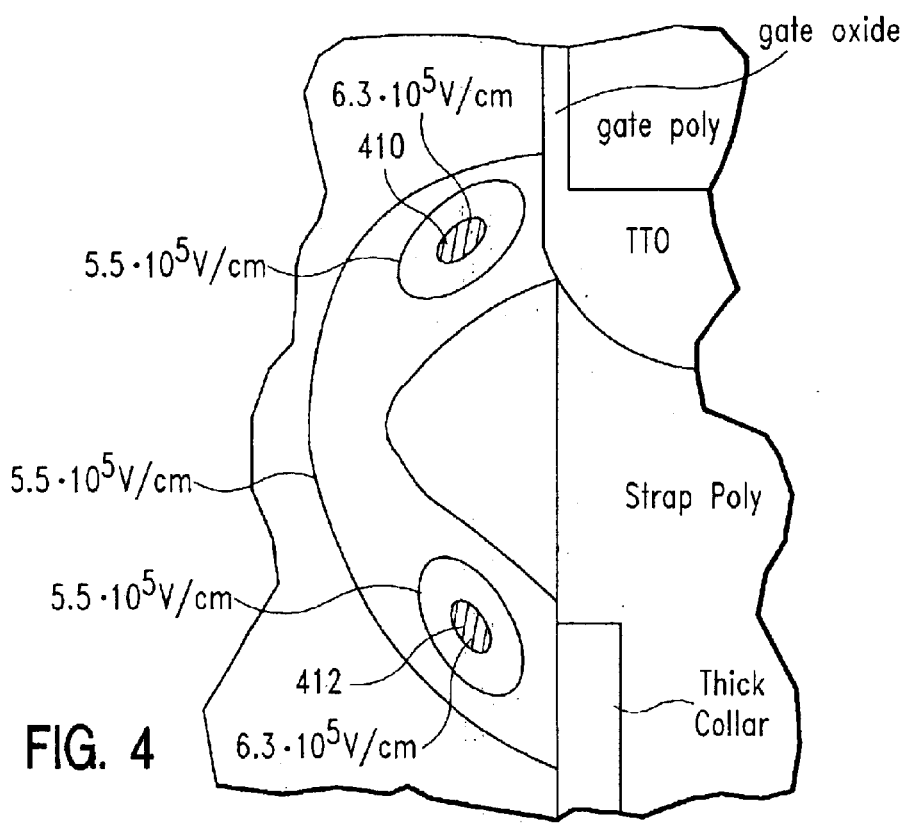
FIG. 4 is an illustration of the contours of an E-field in the vicinity of the strap outdiffusion.

FIG. 4 is an illustration of a modeled electric field with contours in the vicinity of the strap diffusion for typical operating conditions (i.e. Vnode=1.5 V, Vpw=0.5V, Vwl=0.0). Note the occurrence of two local maxima in FIG. 4, shown at (410) and (412) respectively. One local maximum is at the top (410) and the other at the bottom (412) of the diffusion.

As provided in the embodiments described below, it may be possible to reduce the peak electric field strength in the buried strap outdiffusion in one or both of two areas, namely, near the bottom and near the top of the buried strap outdiffusion. These goals may be facilitated by the following described embodiments: the first in which the isolation collar has a reduced thickness adjacent the buried strap outdiffusion, and a second in which a lightly doped drain extension is formed between the buried strap outdiffusion and the vertical transistor thereabove.

1. Reduced Thickness Isolation Collar Adjacent Buried-Strap Outdiffusion

Figure 5:
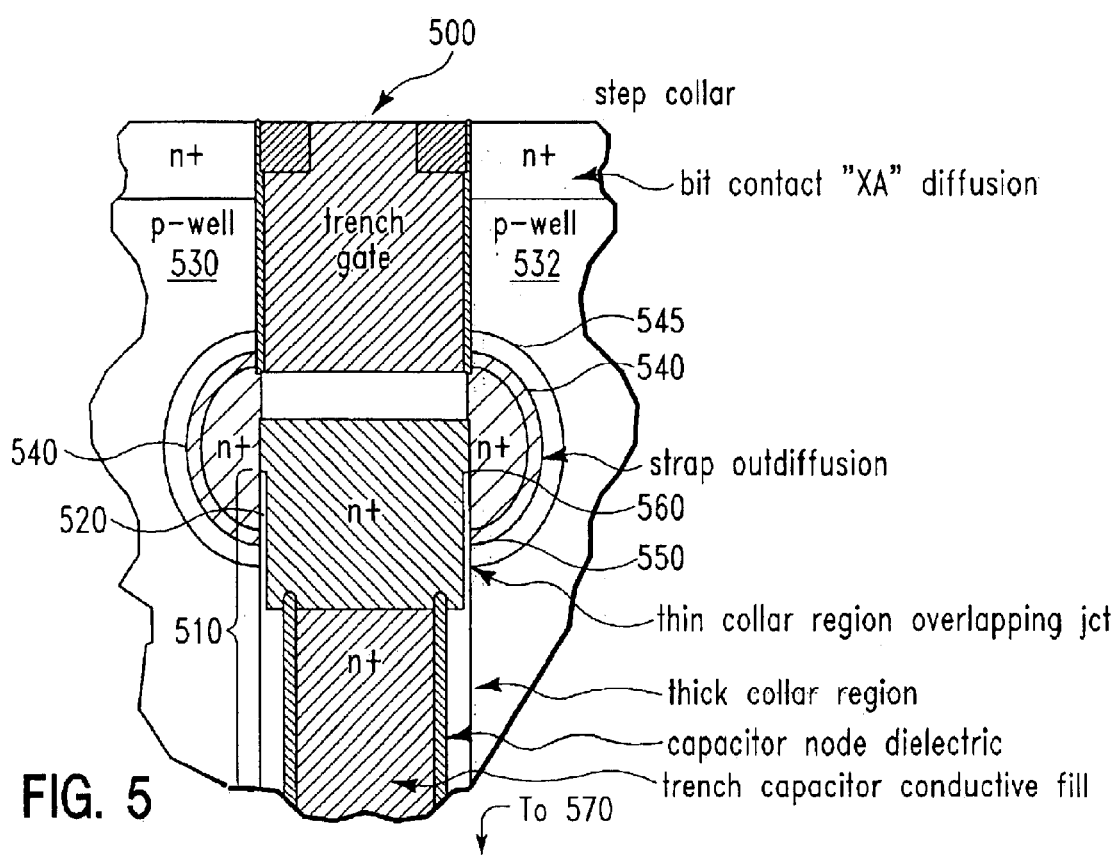
FIG. 5 is an illustration of a step collar structure as per one embodiment of the present invention.

FIG. 5 illustrates a first embodiment, in which the isolation collar 510 has reduced thickness portion 520 where it contacts the buried strap outdiffusion 540. P-wells are shown at 530 and 532 respectively. Preferably, the reduced thickness portion 520 of the collar 510 extends behond the p-n junction depletion region 545 of the buried strap outdiffusion 540. Preferably, the reduced thickness extends as much as 50 nm vertically downward from the upper edge 560 of the isolation collar, and more preferably between about 30 to 40 nm. Since the reduced thickness portion 520 of the collar 510 extends a relatively short distance from the upper edge 560, vertical parasitic conduction between the buried strap outdiffusion 540 and the buried-plate diffusion 570 is maintained within a tolerable limit, the otherwise thick isolation collar 510 causing the vertical parasitic transistor along its length to have high threshold voltage (Vt), and accordingly low sub-Vt leakage.

In a preferred embodiment, the reduced thickness portion 520 is between about 3 nm and 10 nm in thickness, with 6 nm being most preferred. Other than the reduced thickness portion 520, the isolation collar 510 preferably has a thickness of about 20 nm or greater, 30 nm being a preferred thickness.

Figure 6:
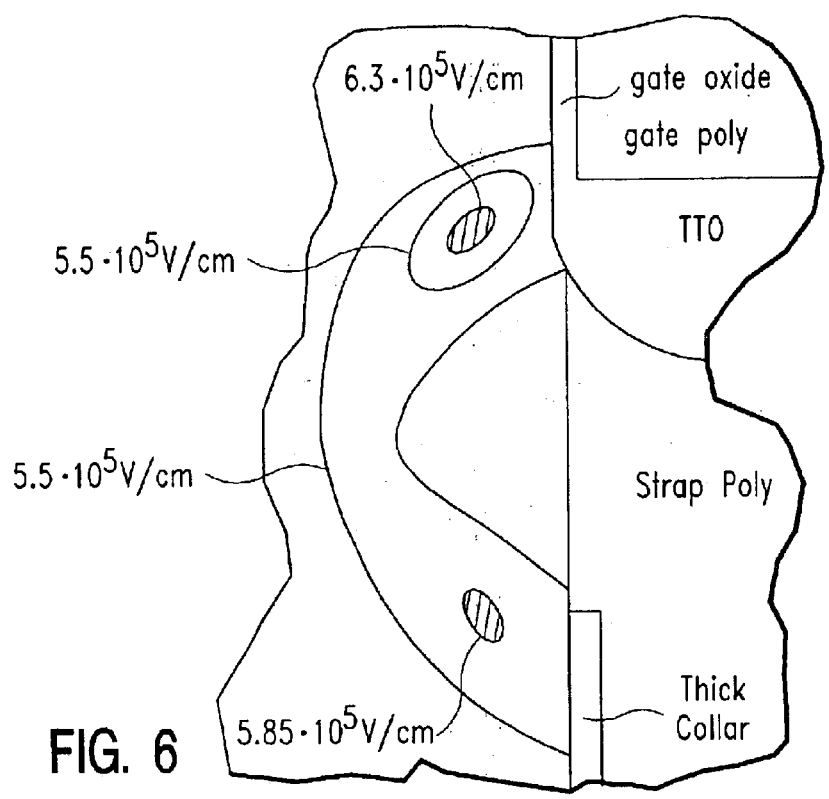
FIG. 6 is an illustration of the contours of an E-field in the vicinity of the strap outdiffusion as per the embodiment shown in FIG. 5.

As shown in FIG. 6, the presence of the reduced thickness portion 520 reduces the magnitude of the electric field between the DT poly and the N+BS outdiffusion. Contours of E-field in the vicinity of the strap outdiffusion for the step collar geometry (in one embodiment Tcol=6 nm overlapping BS P-well junction). Compared to that of FIG. 4, the potential distribution in that region is less affected by the presence of P-well. A reduction in the peak electric field at the bottom of the diffusion of 7%, in the example provided in FIG. 6, can lead to a drop of more than $2 \times 10^{17}$ #cm$^{-3}$ in P-well concentration. To obtain such values using a standard geometry would require dropping the P-well concentration below $3 \times 10^{17}$ #cm$^{-3}$. At such low values most DRAM cells would fail data due to transient loss of a stored "1".

Figures 7, 8:
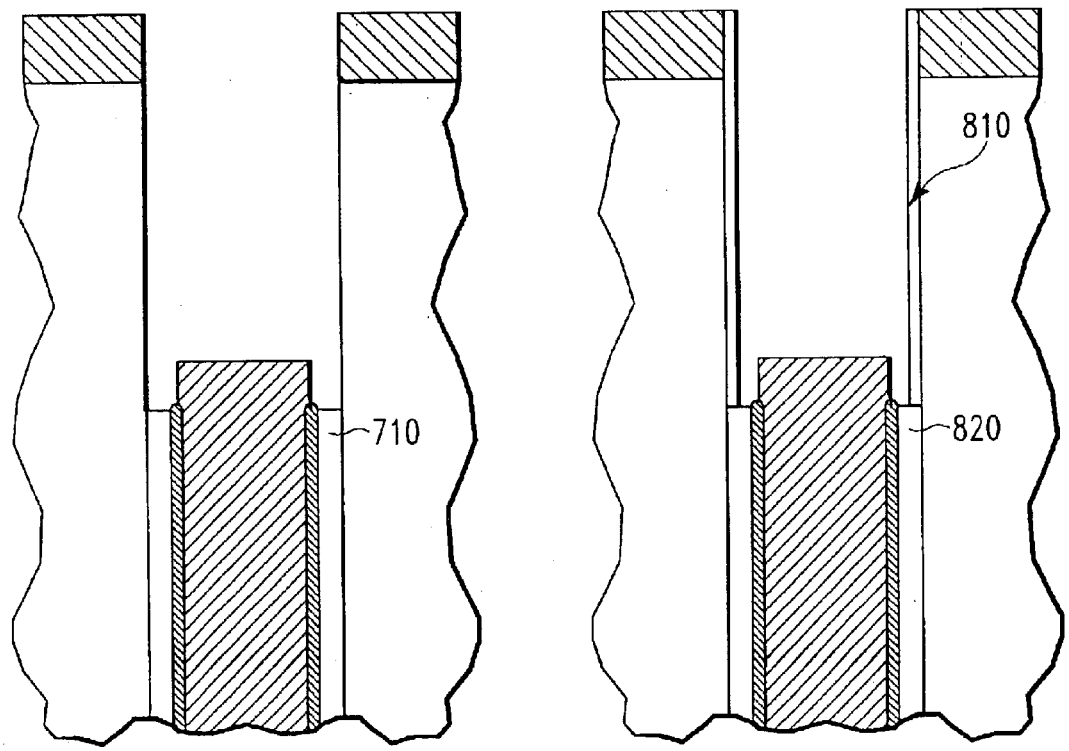
FIGS. 7 through 10C illustrate a process of forming a reduced thickness isolation collar, according to an embodiment of the invention.

The process of manufacturing the embodiment shown in FIG. 5 is provided in FIGS. 7–10. FIG. 7 shows a standard storage trench processing and the buried-plate diffusion, node dielectric formation and standard collar formation followed by conductive trench fill and planarization and recess as known by those skilled in the art. The exposed portions of the collar oxide 710 is also etched. As shown in FIG. 8, a collar dielectric 810 is formed on the sidewalls of the trench having reduced thickness, compared to that of the lower portion 820 of the collar. The collar dielectric 810 preferably includes SiO2, SiN, nitridized oxide, or combination of such materials. The reduced thickness of the collar dielectric 810 is preferably between about 3 nm and 10 nm, with 6 nm being more highly preferred.

Figure 9:
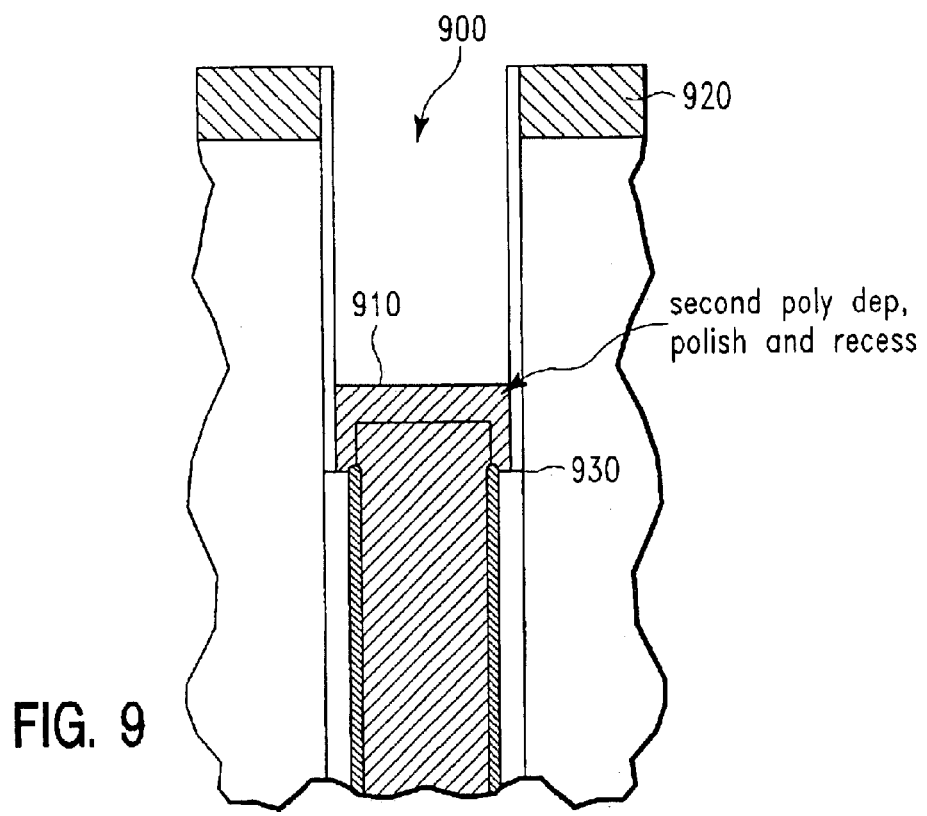
Figures 10A, 10B:
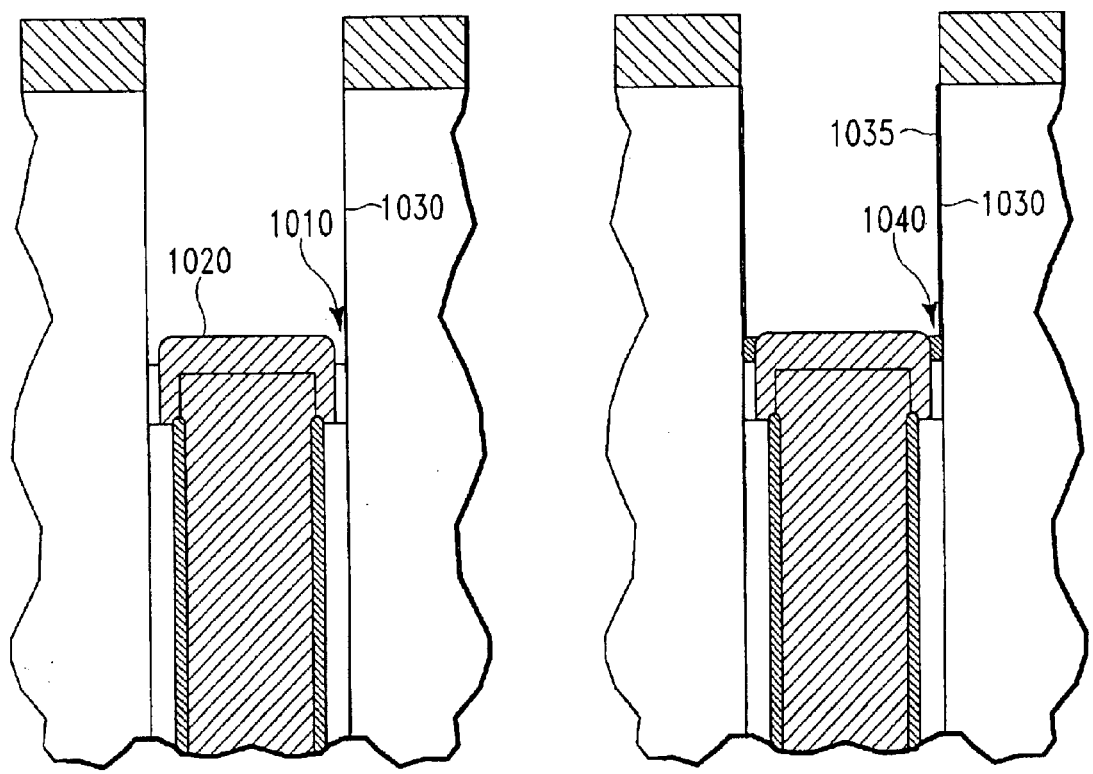
Figure 10C:
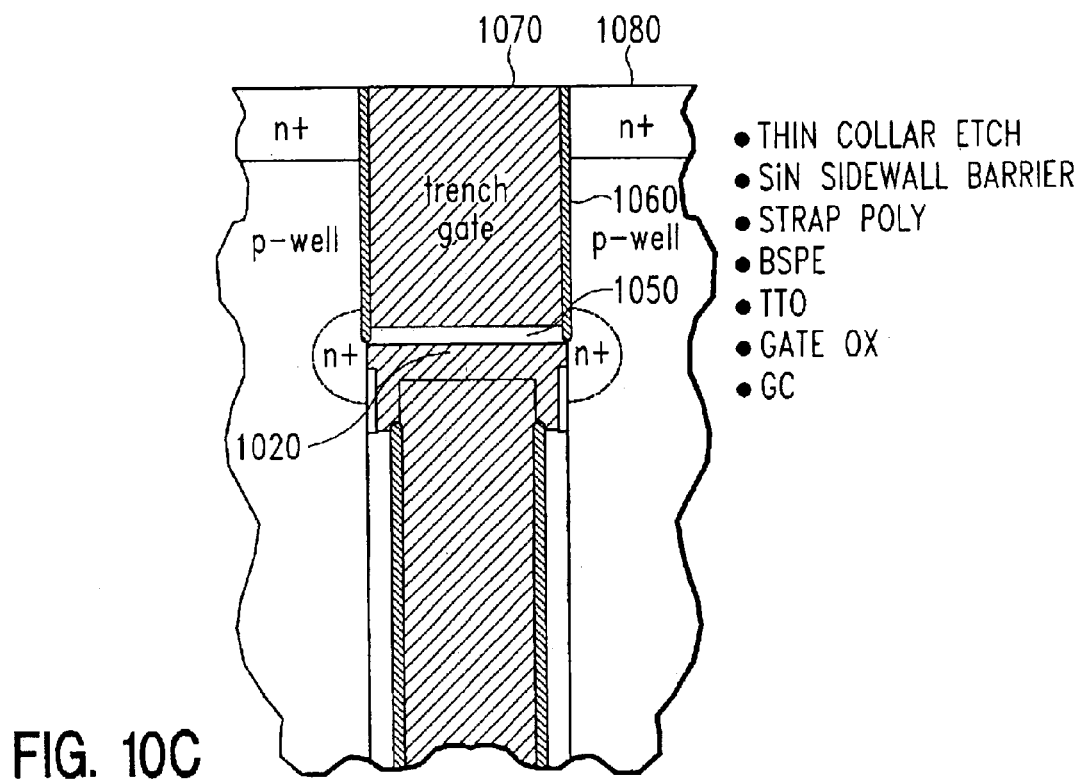

As illustrated in FIG. 9, polysilicon 910 is deposited into the trench 900, which is then planarized (e.g. by CMP polishing) to the surface of the pad nitride layer 920, and then recessed to a depth of preferably 30 to 40 nm above the top 930 of the thick portion of the isolation collar. Then, as shown in FIG. 10A, the exposed portion of the collar is removed and a divot 1010 is formed between the node conductor polysilicon 1020 and the trench sidewall 1030 of the single crystal semiconductor. Next, as illustrated in FIG. 10B, a thin barrier layer 1035 of SiN of preferably less than 1 nm thickness, or other suitable material is deposited and then a layer of highly doped polysilicon is deposited as a strap material 1040 to fill the divot 1010. The strap material 1040 is then isotropically etched such that it is removed from the exposed sidewall 1030 while remaining in the divot 1010. Then, as illustrated in FIG. 10C, a trench top oxide layer 1050, preferably deposited by high density plasma process, is formed on the top surface of the node conductor polysilicon 1020. The thin barrier layer (preferably of SiN) is then removed from the exposed sidewalls and normal array gate processing is then followed (which includes sacrificial oxidation of the exposed sidewalls and subsequent oxide etch—to remove damaged single crystal semiconductor material from the sidewall, then formation of a gate dielectric 1060, deposition of a gate polysilicon 1070, and subsequent planarization to the top surface 1080 of the single crystal semiconductor.

Figure 11:
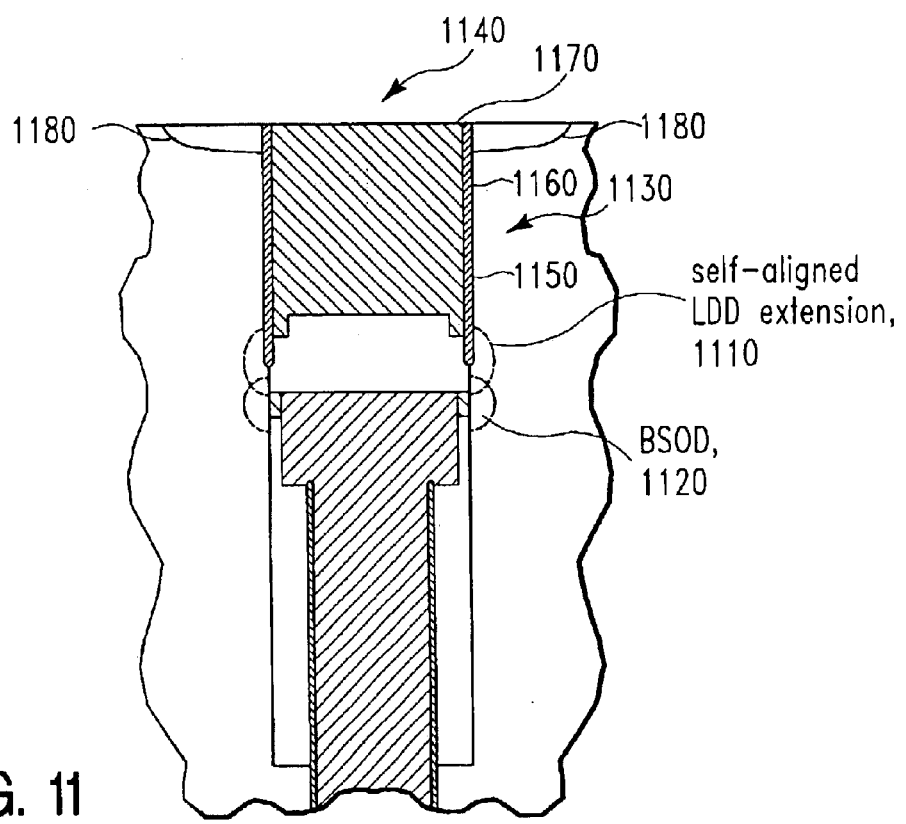
FIG. 11 illustrates another embodiment of the invention having a lightly doped drain (LDD) extension at the top of the buried strap outdiffusion (BSOD).

2. Lightly Doped Drain Extension between Buried Strap Outdiffusion and Transistor In another preferred embodiment, as shown in FIG. 11, a structure and method is provided for forming a lightly doped drain (LDD) extension 1110 between the buried strap outdiffusion 1120 and a vertical transistor 1130 formed along a sidewall 1150 of a trench 1140. Such LDD extension 1110 may assist in reducing the peak electric field ("E-field") near the top of the buried strap outdiffusion 1120. When used together with the first embodiment in which the isolation collar is provided with a reduced thickness adjacent to the buried strap outdiffusion, it may be possible to significantly reduce the peak electric field strength in the buried strap outdiffusion, from that which would otherwise be.

Figure 12:
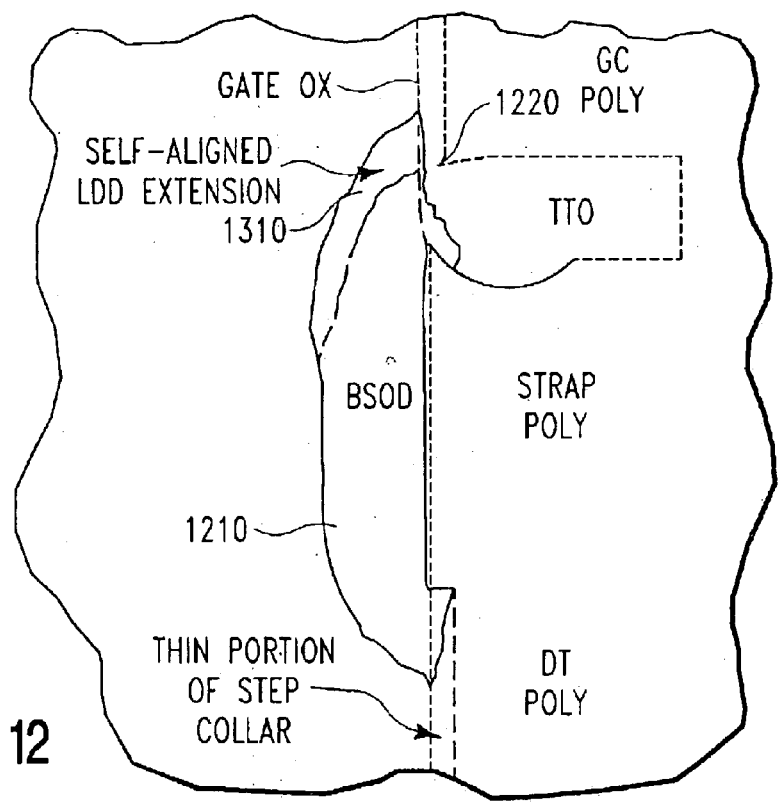
FIG. 12 illustrates the buried strap junction, both with and without the addition of a self-aligned lightly doped drain (LDD) extension.
Figure 13:
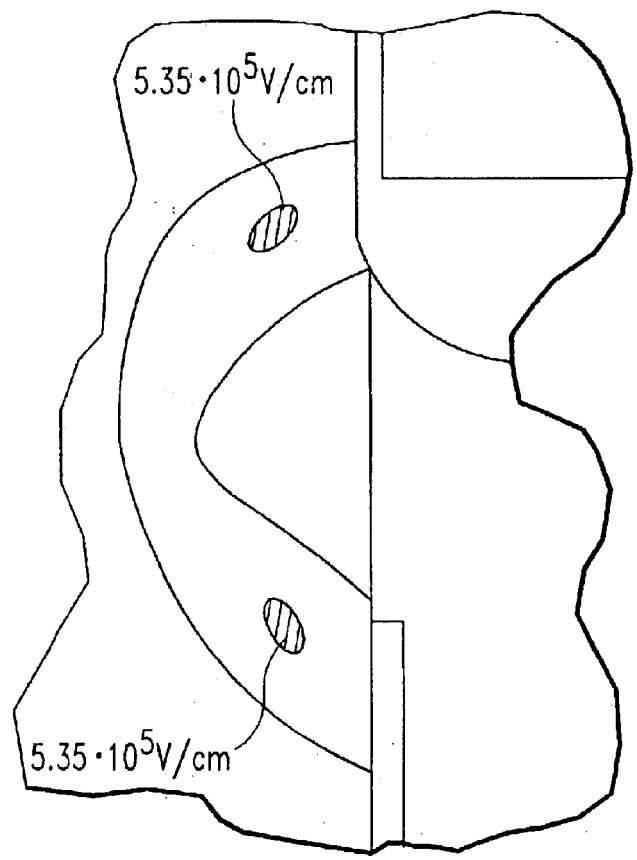
FIG. 13 illustrates the contours of the E-field as per the embodiment shown in FIG. 11.

FIG. 12 is a graph illustrating a modeled junction depth for the above-described embodiment in which the isolation collar has a reduced thickness adjacent the buried strap outdiffusion. The modeled buried strap outdiffusion shows minimal overlap between the buried strap outdiffusion 1210 and the gate edge 1220 In such model, a low thermal budget process has been applied to minimize strap outdiffusion. If the thickness of the trench top oxide (TTO) is not well controlled, and becomes thicker, such overlap may vanish, resulting in severe degradation of the electrical characteristics of MOSFET (i.e. Sub-Vt swing, and back bias sensitivity, among others). FIG. 12 further illustrates the junction depth for when a lightly doped drain (LDD) extension 1310 is formed between the buried strap outdiffusion and the gate of the vertical transistor. The effect of adding the self-aligned LDD extension to the strap outdiffusion can be easily seen. Peak concentration of the LDD extension, in one preferred embodiment is approximately $1\times10^{18}$ #cm$^{-3}$, compared to about $1\times10^{19}$ #cm$^{-3}$ of the buried strap outdiffusion. According to a preferred embodiment, modeling predicts a more than 15% reduction in the peak E-field when the LDD extension is formed between the buried strap outdiffusion and the vertical transistor thereabove, as seen in FIG. 13.

Figure 14:
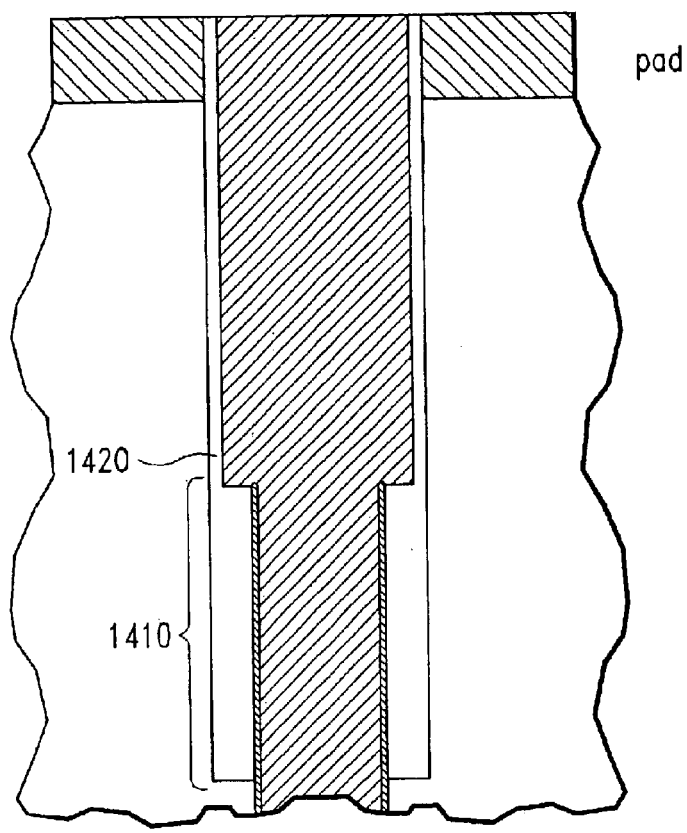
FIGS. 14 through 21 illustrates steps in a process for forming an embodiment illustrated in FIG. 11.

FIGS. 14–21 illustrate a process embodiment for forming the structure illustrated in FIG. 11. In FIG. 14 standard storage trench processing is followed through buried-plate diffusion, node dielectric formation, standard collar formation, conductive trench fill, planarization and recess. Preferably, the isolation collar is provided with a reduced thickness 1420 in an upper portion, as shown and described relative to FIGS. 7, 8 and 9 above.

Figure 15:
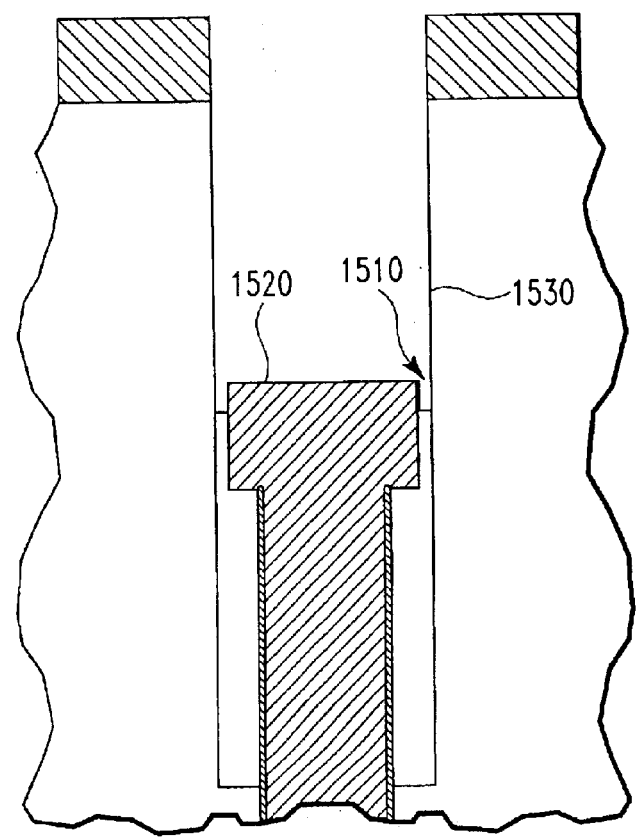
Figure 16:
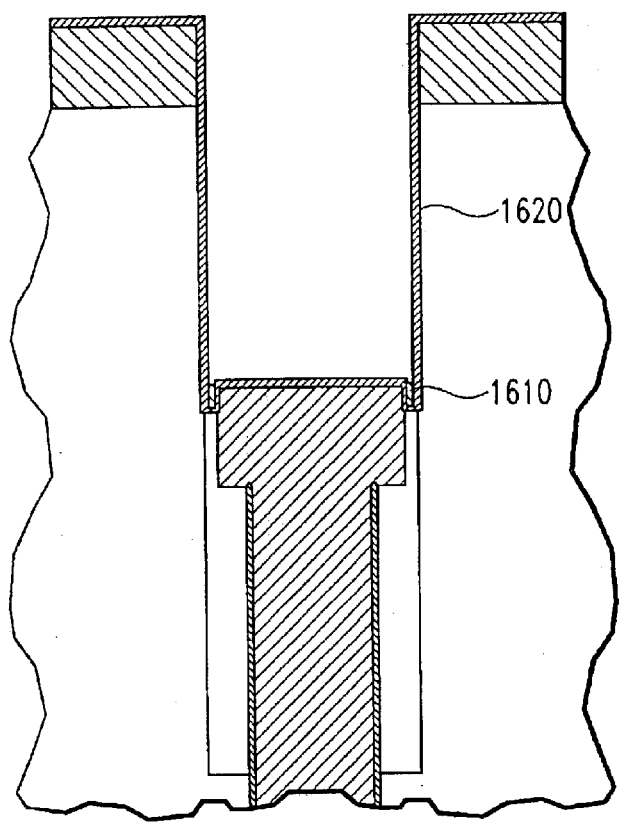
Figure 17:
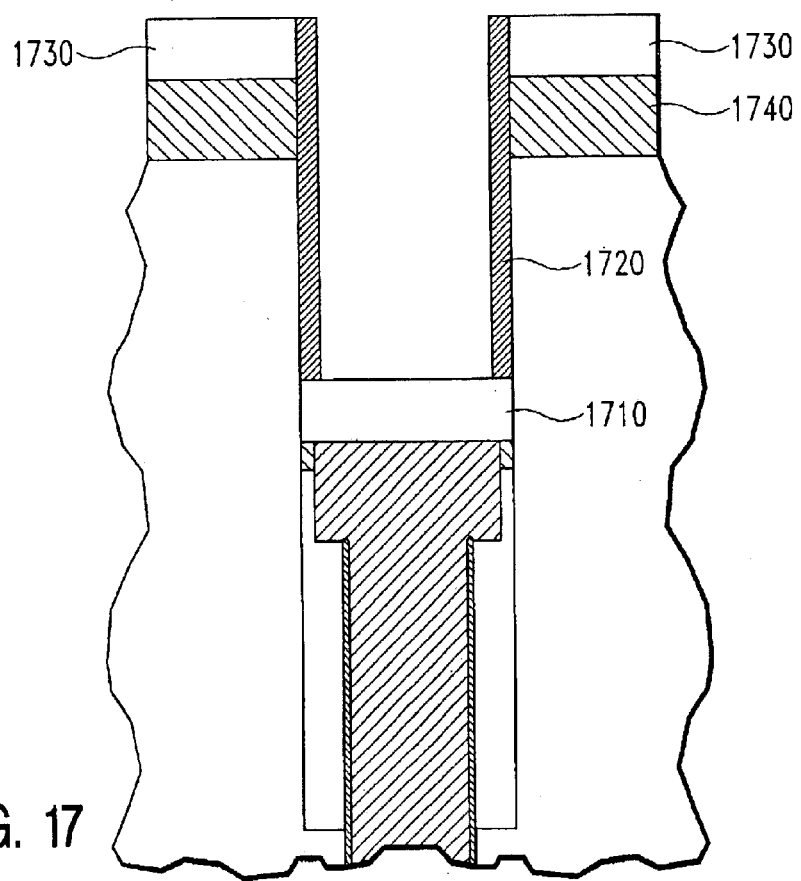

In FIG. 15, the exposed portion of the collar is isotropically etched, leaving a divot 1510 between the DT poly 1520 and the sidewall 1530 of the storage trench. In FIG. 16, a thin barrier layer 1620 of a material such as SiN is deposited (preferably less than 1 nm thick), followed by deposition of buried strap poly 1610 and isotropic etching of the buried strap poly from the exposed surfaces, leaving the divot filled with the strap poly material 1610. In FIG. 17, a first TTO layer (TTO1 as shown at (1710)) over the trench poly, and spacers of preferably silicon nitride as shown at (1720) are formed on the trench sidewalls. As a byproduct of this deposition, oxide layer 1730 is formed over the pad nitride 1740.

Figure 18:
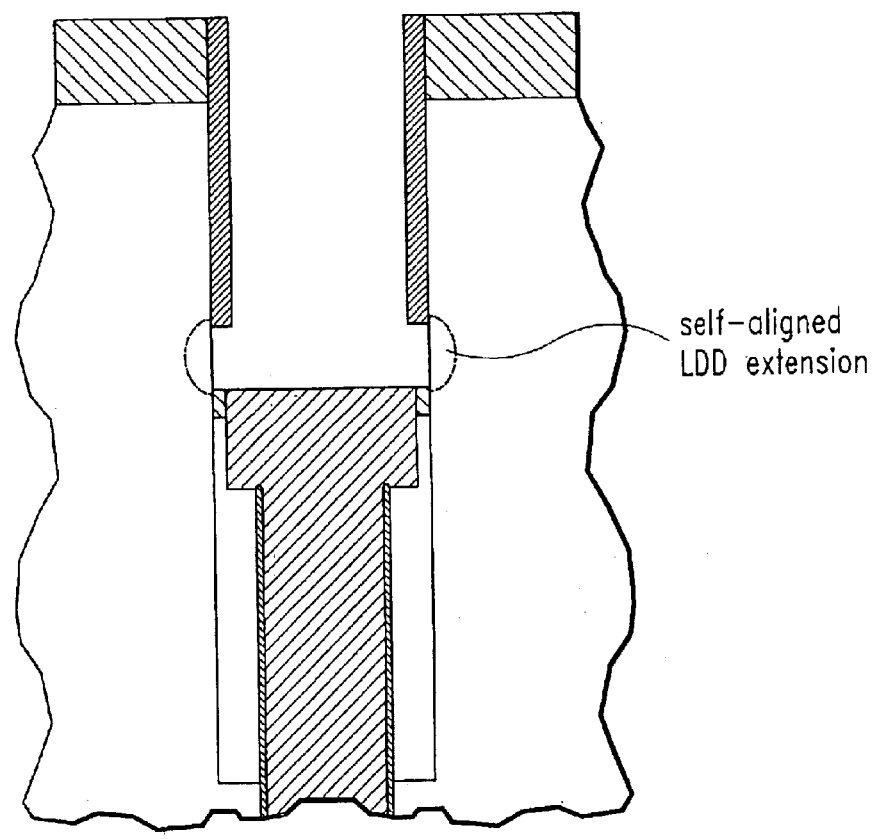

As shown in FIG. 18, the TTO1 layer is removed, preferably by isotropic etching. If desired, the oxide layer 1730 over the pad nitride 1740 can be removed by a resist recess and planarization process. LDD strap doping is introduced into the exposed sidewall aperture by means such as gas phase doping, tilted implantation, phosphosilicate glass, or other doped glass, plasma doping, plasma immersion ion implantation or similar methods as known to those skilled in the art.

Figure 19:
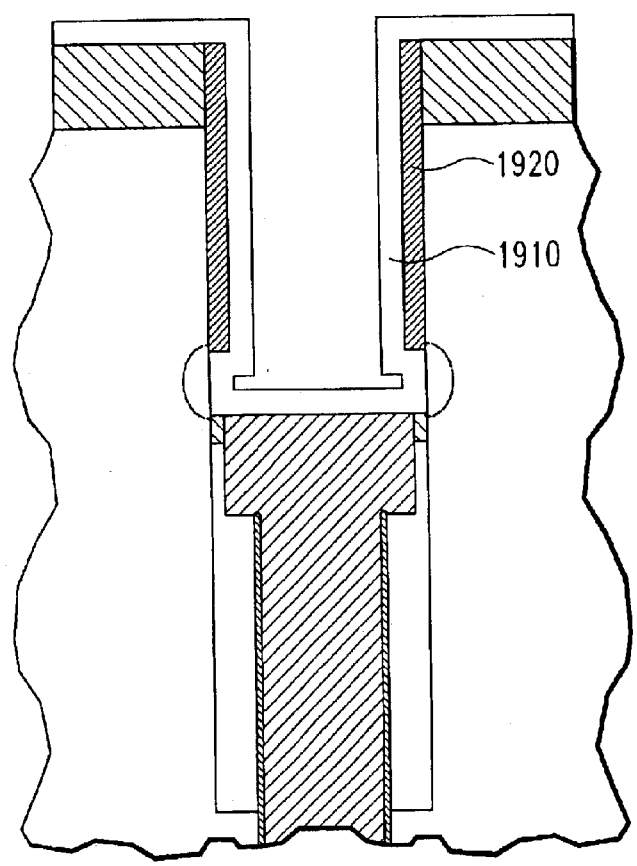
Figure 20:
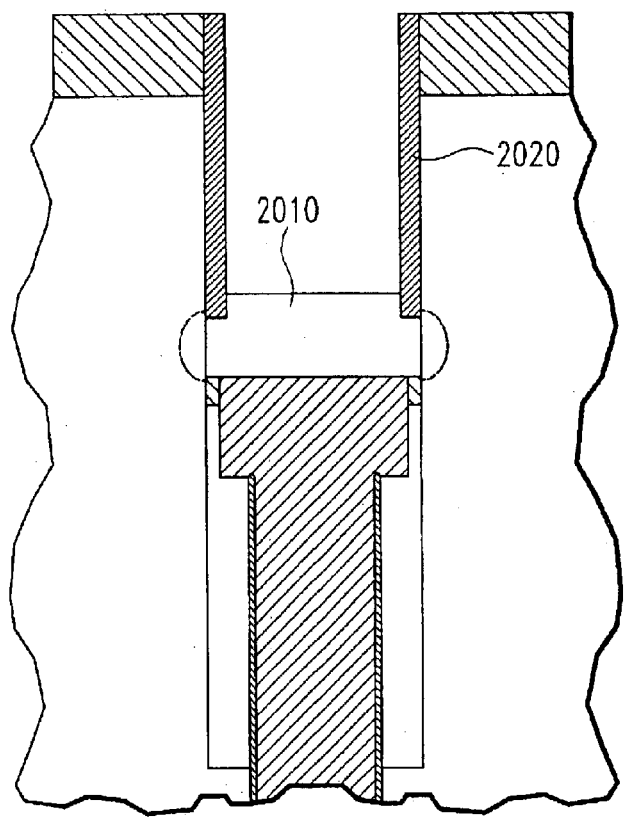
Figure 21:
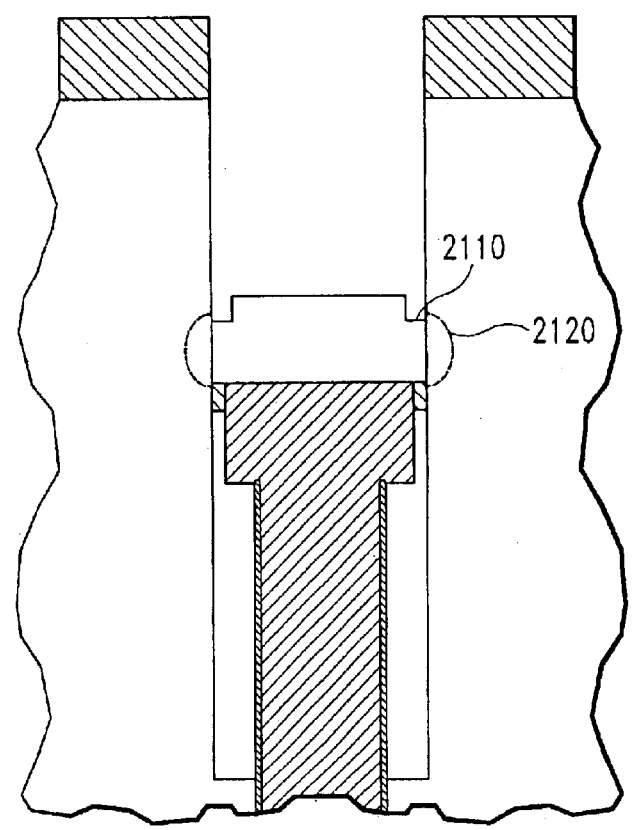

FIG. 19 provides for the introduction of a thin conformal dielectric as shown at (1910). The thin layer is deposited is preferably of SiO2 and is intended to at least partially fill the cavity under the hanging spacers 1920 created by removal of TTO1 to facilitate the subsequent formation of a second TTO layer as provided in FIG. 20 shown at (2010). In FIG. 20 the second TTO layer 2010 is preferably deposited by high density plasma process (HDP). An etchback is then performed to remove the dielectric liner 1910 from the sidewall nitride spacers. As shown in FIG. 21, the nitride sidewall spacers 2020 are then isotropically etched out. This leaves the edge of the trench top oxide 2110 overlying the DT poly self-aligned with the edge of the LDD extension 2120.

Referring to FIG. 11 again, further steps are performed to result in the structure illustrated therein. A gate dielectric 1160 has been formed along sidewall 1150, the gate conductor 1170 is deposited, and diffusions 1180 are formed at the top of the single crystal semiconductor to complete the vertical MOSFET transistor 1130. Hot process associated with the sacrificial oxidation of the trench sidewall 1150, prior to gate oxidation, drives the dopant from the strap polysilicon into the single crystal semiconductor to form the buried strap outdiffusion 1120.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. An integrated circuit having a dynamic random access memory (DRAM), said DRAM having a memory cell including:
    a storage capacitor having a capacitor dielectric disposed along a sidewall of a trench extending into a region of substrate, said region consisting essentially of semiconductor;
    a node conductor provided within said trench, said node conductor conductively contacting said storage capacitor from above;
    a buried strap outdiffusion (BSOD) disposed adjacent to said trench in said region, said BSOD being conductively coupled to said node conductor;
    an isolation collar disposed along said sidewall of said trench, said isolation collar separating said node conductor from said region, said isolation collar having a reduced thickness where said isolation collar contacts said BSOD and having at least a second thickness substantially greater than said reduced thickness other than where said isolation collar contacts said BSOD.

2. The integrated circuit of claim 1, wherein said memory cell is a first memory cell, said storage capacitor is a first storage capacitor and said trench is a first trench, said DRAM further comprising a second said memory cell including a second storage capacitor having a capacitor dielectric disposed along a sidewall of a second trench, said second trench disposed adjacent to said first trench, said BSODs of said memory cell and said second memory cell being located in a p-well portion of said region, wherein said p-well has a dopant concentration of up to about $4\times10^{17}$ cm$^{-3}$.

3. The integrated circuit of claim 1, wherein said reduced thickness of said isolation collar is about one half of said second thickness or less.

4. The integrated circuit of claim 1, wherein said reduced thickness is about 10 nm or less and said second thickness is about 20 nm or greater.

5. The integrated circuit of claim 1, wherein said reduced thickness of said isolation collar extends downwardly as much as 50 nm in a vertical direction along said sidewall of said trench.

6. The integrated circuit of claim 1, wherein said memory cell further comprises a lightly doped drain (LDD) extension disposed in said region, said LDD extension conductively coupling said BSOD to a transistor having at least a portion disposed along said sidewall of said trench above said storage capacitor.

7. The integrated circuit of claim 6, wherein said LDD extension has a peak dopant concentration of about $1\times10^{18}$ cm$^{-3}$.

8. The integrated circuit of claim 1, wherein said BSOD has a peak dopant concentration of about $1\times10^{19}$ cm$^{-3}$.

9. An integrated circuit, comprising:

a storage capacitor having a capacitor dielectric disposed along a sidewall of a trench extending into a region of a substrate, said region consisting essentially of a semiconductor, a node conductor provided within said trench, said node conductor conductively contacting said storage capacitor from above;

a buried strap outdiffusion (BSOD) disposed adjacent to said trench in said region, said BSOD being conductively coupled to said node conductor;

an isolation collar disposed along said sidewall of said trench, said isolation collar separating said node conductor from said region, said isolation collar having a reduced thickness substantially greater than said reduced thickness other than where said isolation collar contacts said BSOD.

10. The integrated circuit 9, wherein said reduced thickness of said isolation collar is about one half of said second thickness or less.

11. The integrated circuit of claim 9, wherein said reduced thickness of said isolation collar extends downwardly as much as 50 nm in a vertical direction along said sidewall of said trench.

12. The integrated circuit of claim 9, further comprising a lightly doped drain (LDD) extension disposed in said region, said LDD extension conductively coupling said BSOD to a transistor having at least a portion disposed along said sidewall of said trench above said storage capacitor.

* * * * *